United States Patent
Wu et al.

(10) Patent No.: US 9,530,617 B2
(45) Date of Patent: Dec. 27, 2016

(54) IN-SITU CHARGING NEUTRALIZATION

(71) Applicant: Taiwan Semiconductor Manufacturing Co., Ltd., Hsin-Chu (TW)

(72) Inventors: Lin-Jung Wu, Miaoli (TW); Jyh-Shiou Hsu, Hsin-Chu (TW); Chi-Ming Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 745 days.

(21) Appl. No.: 13/753,627

(22) Filed: Jan. 30, 2013

(65) Prior Publication Data

US 2014/0210506 A1  Jul. 31, 2014

(51) Int. Cl.
*H01J 37/32* (2006.01)
*H01L 21/66* (2006.01)

(52) U.S. Cl.
CPC .... *H01J 37/32073* (2013.01); *H01J 37/32935* (2013.01); *H01L 22/20* (2013.01); *H01L 22/14* (2013.01)

(58) Field of Classification Search
CPC ............. H01J 37/32073; H01J 37/32935; H01L 23/20; H01L 22/14; G01R 31/2601
USPC .................................................. 324/762.05
See application file for complete search history.

(56) References Cited

U.S. PATENT DOCUMENTS

| | | | |
|---|---|---|---|
| 6,759,347 B1* | 7/2004 | Cheng et al. | 438/778 |
| 2002/0025388 A1* | 2/2002 | Bhardwaj et al. | 427/569 |
| 2003/0129776 A1* | 7/2003 | Eom et al. | 438/17 |
| 2006/0267622 A1* | 11/2006 | Lagowski et al. | 324/765 |
| 2007/0188185 A1* | 8/2007 | Eom et al. | 324/765 |
| 2007/0221844 A1* | 9/2007 | Yamanashi et al. | 250/309 |
| 2007/0235135 A1* | 10/2007 | Nishio | H01J 37/32091 156/345.28 |
| 2009/0250077 A1 | 10/2009 | Harano et al. | |
| 2010/0062613 A1* | 3/2010 | Kim et al. | 438/778 |
| 2011/0174777 A1* | 7/2011 | Jensen et al. | 216/61 |
| 2012/0229145 A1* | 9/2012 | Kerber | G01R 31/129 324/537 |

FOREIGN PATENT DOCUMENTS

| | | |
|---|---|---|
| JP | 2009089176 A | 4/2009 |
| KR | 100189983 B1 | 1/1999 |
| KR | 20030061093 A | 7/2003 |

(Continued)

OTHER PUBLICATIONS

Notice of Allowance dated Dec. 8, 2014 in connection with Korean Patent Application No. 10-2013-0057111.

(Continued)

*Primary Examiner* — Melissa Koval
*Assistant Examiner* — Courtney McDonnough
(74) *Attorney, Agent, or Firm* — Eschweiler & Associates, LLC

(57) ABSTRACT

Some embodiments relate to a method for semiconductor processing. In this method, a semiconductor wafer is provided. A surface region of the semiconductor wafer is probed to determine whether excess charge is present on the surface region. Based on whether excess charge is present, selectively inducing a corona discharge to reduce the excess charge. Other techniques are also provided.

20 Claims, 5 Drawing Sheets

(56) References Cited

FOREIGN PATENT DOCUMENTS

TW 200717629 A 5/2007

OTHER PUBLICATIONS

Office Action Dated Aug. 7, 2014 KR Patent Application No. 10-2013-0057111.
Marinskiy, et al. "New Approach to Surface Voltage Based Non-Visual Defect Inspection" ECS Transactions, 60 (1) 917-922 (2014).
Dukic "Vibrating Kelvin Probe Measurements of a Silicon Surface with the Underside Exposed to Light" Georgia Institute of Technology Dec. 2007.
Marinskiy, et al. "Measuring CET of High-K Dielectrics with Novel Kinetic Approach Using Micro-Site Corona—Kelvin Method" Nov. 2013.

* cited by examiner

100

600

IN-SITU CHARGING NEUTRALIZATION

BACKGROUND

Moore's law is the observation that the number of transistors on integrated circuits doubles approximately every two years. The performance improvements of many electronic devices are strongly linked to Moore's law. For example, the speed of microprocessors, capacity of memory devices capacitor, sensitivity of sensors, and even the number and size of pixels in digital cameras are linked to Moore's law.

Moore's law continues to hold true because of on-going improvements in semiconductor processing techniques. These improvements allow fabrication facilities to fabricate smaller, lower power transistors that have faster switching times than previous technology generations, and to make these transistors on silicon wafers that are larger than previous generations of silicon wafers. For example, whereas previous technology generations may have been characterized by transistor gates having lengths of approximately 30 nm formed on silicon wafers having a diameter of 300 millimeters (so-called "300 mm wafers"), next generation technologies may be characterized by transistor gates having lengths of less than 10 nm formed on silicon wafers with a diameter of 450 millimeters (so called "450 mm wafers"). This combination of smaller transistors packed more tightly onto larger wafers (and larger integrated circuits) has powered significant technology advances in recent decades. Significant challenges arise when developing new technology nodes.

DETAILED DESCRIPTION

Figure 1A:
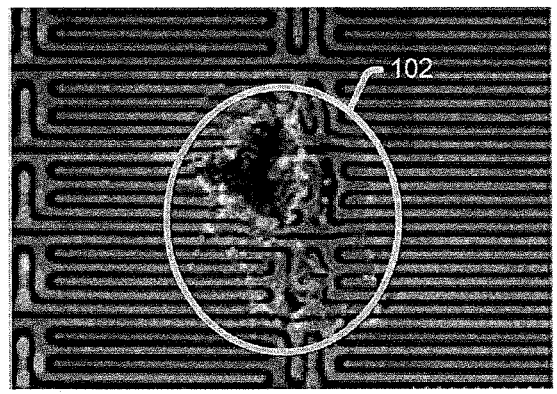
FIG. 1A shows an example of an integrated circuit or wafer having a damaged region.

One or more implementations of the present invention will now be described with reference to the attached drawings, wherein like reference numerals are used to refer to like elements throughout. The drawings are not drawn to scale.

Figure 1B:
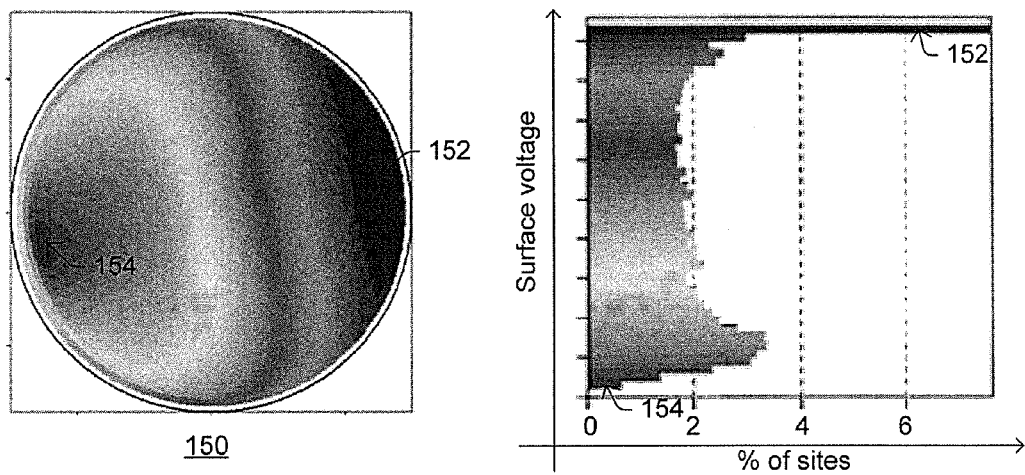
FIG. 1B shows a wafer that has a variation in surface voltage.

One particular challenge associated with transitioning to larger wafers (e.g., from 300 mm to 450 mm wafers) is that excess charge can accumulate on the surface of the wafer during processing. For example, although accumulation of excess charge can occur on 300 mm wafers, it is more difficult to control charge accumulation and to keep charge uniform in the realm of 450 mm wafers, as 450 mm wafers provide over two times the surface area of 300 mm wafers. If this excess charge releases suddenly, it can cause several kinds of damage, particularly when small device features are being manufactured on the wafer (e.g., gate lengths of less than 10 nm and gate dielectric thickness of less than approximately 1 nm). For example, a sudden release of charge can "blow out" an existing gate oxide or can melt a junction region or interconnect layer on the wafer. FIG. 1A shows an example of a wafer or integrated circuit 100 where a sudden release of charge results in a damaged region 102. Charge non-uniformity can also cause more subtle damage. For example, surface voltage non-uniformity during processing, such as shown in FIG. 1B, can cause plasma etching (or other processes) to be non-uniform over the surface of the wafer. In FIG. 1B, some surface regions 152 have higher surface voltages, while other surface regions 154 have lower surface voltages. When plasma etching is carried out, higher voltage surface regions 152 can be etched away more quickly than lower voltage surface regions 154 (or vice versa), leading to non-uniformity in layers over the surface of the wafer. This non-uniformity in the layers can lead to undesired performance variation for chips scribed from different regions across the wafer.

To limit excess charge build-up and/or surface voltage non-uniformity on wafers, the present disclosure measures a surface potential on the wafer surface and uses a corona discharge to reduce charge build-up and/or maintain surface charge uniformity over the wafer surface. This corona discharge is an electrical discharge brought on by the ionization of gas within a process chamber by a corona gun electrode that is electrically energized. In corona discharge, a current flows from the corona gun electrode, which has a high potential, into a neutral gas in the process chamber by ionizing that gas so as to create a region of plasma around the corona gun electrode. The ions generated eventually pass charge to nearby areas of lower potential, or recombine to form neutral gas molecules. The discharge occurs when the strength (potential gradient) of the electric field around the corona gun electrode is high enough to form a conductive region, but not high enough to cause electrical breakdown or arcing to nearby objects. It is often seen as a bluish (or other color) glow in the air adjacent to pointed metal conductors carrying high voltages.

Figure 2:
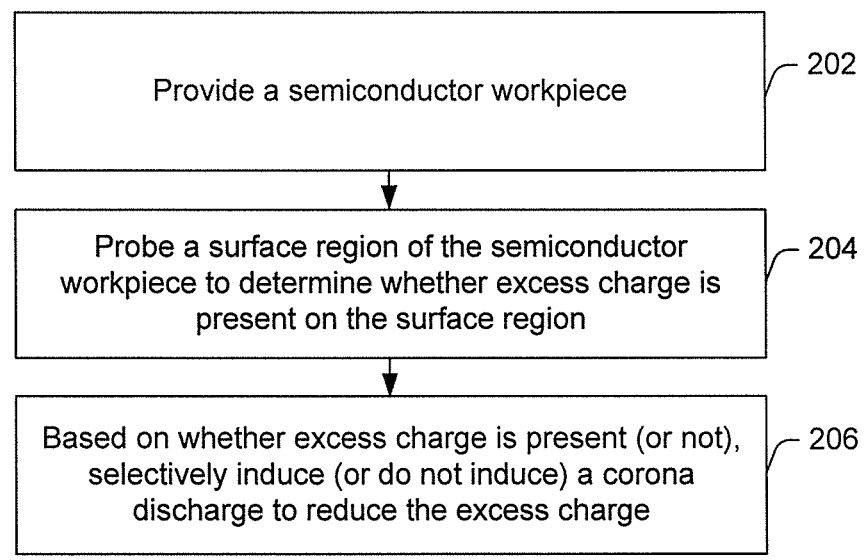
FIG. 2 shows a flow chart depicting some embodiments of a method of semiconductor processing that uses selective corona discharge techniques to promote charge uniformity on a semiconductor wafer.

Turning now to FIG. 2, one can see some embodiments of a semiconductor processing method that limits excess charge buildup or which establishes charge uniformity for a semiconductor wafer using corona discharge techniques. Although this method is illustrated as a series of discrete blocks or acts, it will be appreciated that same of these acts or blocks can be performed concurrently in some implementations and/or some acts or blocks can be broken into sub-acts or sub-blocks in some implementations. Further, the order of the acts or blocks can vary from what is provided in the illustrated figure.

The method starts at 202 when a semiconductor wafer is provided. At 204, a surface region of the semiconductor wafer is probed to determine whether excess positive or negative charge is present on the surface region. In 206, based on whether excess charge is present (or not present), the method selectively induces a corona discharge to reduce the excess charge and/or establish charge uniformity. Because the corona discharge is capable of dissipating excess charge from the wafer in a more gradual manner compared to sudden electrical arcing, corona discharge provides a reliable manner of reducing excess charge buildup and thereby maintaining surface charge uniformity. Further, because corona discharge does not require direct physical contact between an electrode and the semiconductor wafer, it can also limit contaminants from coming into contact with the wafer, which helps to reduce defects and thereby improves yields.

Figure 3:
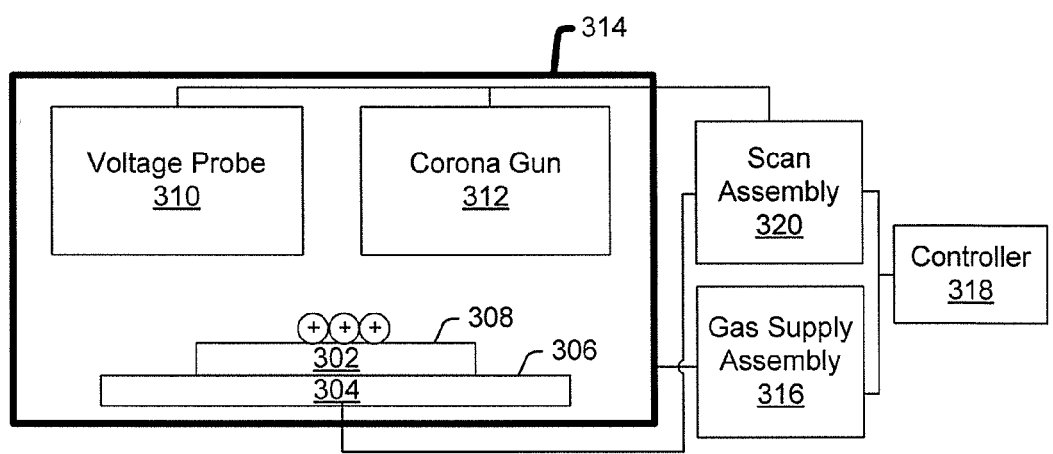
FIG. 3 shows an apparatus for semiconductor processing in accordance with some embodiments.

FIG. 3 shows an apparatus 300 configured to detect charge non-uniformity on a surface of semiconductor wafer 302, and further configured to alter surface charge levels to establish charge uniformity for the wafer surface. In some embodiments, the semiconductor wafer 302 is a silicon wafer having a diameter of approximately 450 mm or more, although semiconductor wafers as disclosed herein are not limited to 450 mm silicon wafers. It will be appreciated that "semiconductor wafer" as referred to herein may comprise any type of semiconductor material including a bulk silicon substrate, a binary compound substrate (e.g., GaAs wafer), a ternary compound substrate (e.g., AlGaAs), or higher order compound substrates, among others. Further, the semiconductor wafer can also include non-semiconductor materials such as oxide in silicon-on-insulator (SOI), partial SOI substrate, polysilicon, amorphous silicon, or organic materials, among others. In some instances, the semiconductor wafer can also include multiple wafers or dies which are stacked or otherwise adhered together. The semiconductor wafer can include wafers which are cut from a silicon ingot, and/or any other type of semiconductor/non-semiconductor and/or deposited or grown (e.g. epitaxial) layers formed on an underlying substrate. It will be appreciated that although these corona discharge techniques may be particularly advantageous in the realm of 400 mm (and larger) wafers, these techniques are also extremely useful in smaller wafers, such as 300 mm wafers or even smaller wafers. Thus, these corona discharge techniques are contemplated as being used with any and all wafer sizes, and should not be limited to any particular wafer size.

To retain the wafer 302, the apparatus 300 includes a chuck 304 having an engagement surface 306. The chuck 304 can use mechanical structures to physically retain the wafer (e.g., arms or fingers to clamp onto an outer edge of wafer 302), pressure assemblies to retain the wafer 302 (e.g., holes and/or a hermetic seal on engagement surface 306 to apply low pressure to backside of wafer to "stick" the wafer 302 to the chuck 304), and/or electro- and/or magnetic-assemblies that employ electrical and/or magnetic fields to adhere the wafer 302 to the engagement surface 306.

To measure charge non-uniformity on the wafer surface region 308, the apparatus 300 includes a voltage probe 310. In some embodiments, the voltage probe 310 comprises a Kelvin probe. The Kelvin probe includes a scanning probe positioned at the end of a cantilever, wherein the probe measures a potential offset between a tip of the scanning probe and the surface region 308. The Kelvin probe can take voltage surface measurements using a two-pass technique. In the first pass, the topography of wafer surface 308 is acquired by mechanically oscillating cantilever and, thus, the scanning probe. In the second pass, this topography of surface 308 is retraced at a set lift height from the wafer surface 308 to detect the electric surface potential $\phi(x)$ of wafer surface 308. During this second pass, the cantilever is excited electrically (rather than mechanically as done for the first pass) by applying to the tip the voltage $V_{tip}$ containing dc and ac components:

$$V_{tip} = V_{dc} + V_{ac} \sin(wt)$$

The resulting capacitive force $F_{cap}$ between the tip and the surface region 308 (having potential $V_s$) is:

$$F_{cap} = (1/2)(V_{tip} - \phi(x))^2 (dC/dz)$$

where C(z) is the tip-surface capacitance. The first harmonic force:

$$F_{cap\ w} = (dC/dz)(V_{dc} - \phi(x))V_{ac} \sin(wt)$$

leads to suitable cantilever oscillations. Feedback then changes the dc tip potential $V_{dc}$ until the w component of the cantilever (and accordingly w component of the tip-force) vanishes, e.g. $V_{dc}(x)$ became equal to $\phi(x)$. So mapping $V_{dc}(x)$ reflects distribution of the surface potential along the surface region 308. If no special tip-sample bias voltage is applied this distribution is Contact Potential Difference distribution. In this way, a two-dimensional mapping of the surface voltages for the wafer surface 308 can be obtained, such as previously illustrated in FIG. 1A, for example.

After the voltage probe 310 has mapped a surface voltage profile for the surface 308, a corona gun 312 selectively induces corona discharge to establish charge uniformity for the surface 308. The selectivity of the corona discharge inducement is based on whether the measured voltage for the surface region has a predetermined relationship with a voltage threshold. In some embodiments, the voltage threshold can be measured relative to other surface regions on the surface 308, such that the overall voltage distribution over the entire wafer surface 308 is uniform. In some embodiments, this voltage threshold can correspond to a pre-catastrophic condition at which a semiconductor device or feature on the semiconductor wafer 302 is subject to an increased risk of damage due to excess charge buildup. Thus, for a positive charge build-up, if the measured voltage for a surface region is greater than or equal to the voltage threshold, the corona gun can be pulsed "on" while over the surface region to induce corona discharge to reduce the surface voltage. On the other hand, if the measured voltage is less than the threshold voltage for positive charge buildup, the corona gun can remain "off" while over the surface region 308. Of course, negative charge buildup can also occur, in which case the voltage thresholds and corona gun pulses can have opposite polarities from cases of positive charge build-up.

In many embodiments, the apparatus 300 also includes a hermetically sealed process chamber 314 to house the semiconductor wafer 302. A gas supply assembly 316, which can include a vacuum pump and gas storage canisters as well as valves, piping, etc.; can provide desired gases to process chamber 314 under direction of controller 318. In some implementations, a high-density-plasma chemical vapor deposition (HDP-CVD) tool (not shown) is also included. This HDP-CVD tool is one example of a tool that can result in buildup of excess or non-uniform charge on the surface region 308. The voltage probe 310 can often measure the surface voltage at the surface region 308 in situ within the hermetically sealed process chamber 314 after the HDP-CVD process is carried out, and the corona gun can selectively induce corona discharge in situ as well. This helps to lessen the chances of contaminants settling on the wafer surface region 308. It will be appreciated that other tools and/or processes (i.e., other than HDP-CVD) can also cause buildup of excess or non-uniform charge on the surface region 308, and nothing in this disclosure will be interpreted in any way as limiting the disclosure to buildup of excess or non-uniform charge occurring through HDP-CVD processes.

As will be appreciated in more detail below with regards to FIGS. 4-7, controller 318 also directs a scan assembly 320 to provide relative movement between the chuck 304 and the voltage probe 310 (and corona gun 312) to thereby map the surface voltage for surface regions of the wafer 302 (and to correspondingly induce corona discharge, if warranted). It will be appreciated that relative movement can be accomplished by moving the chuck 304 independent of the voltage probe 310 (and/or corona gun 312), or by moving the voltage probe 310 (and/or corona gun 312) independent of the chuck 304. The voltage probe 310 (and/or corona gun 312) can also be moved in coordinated fashion with the chuck 304.

Figure 4:
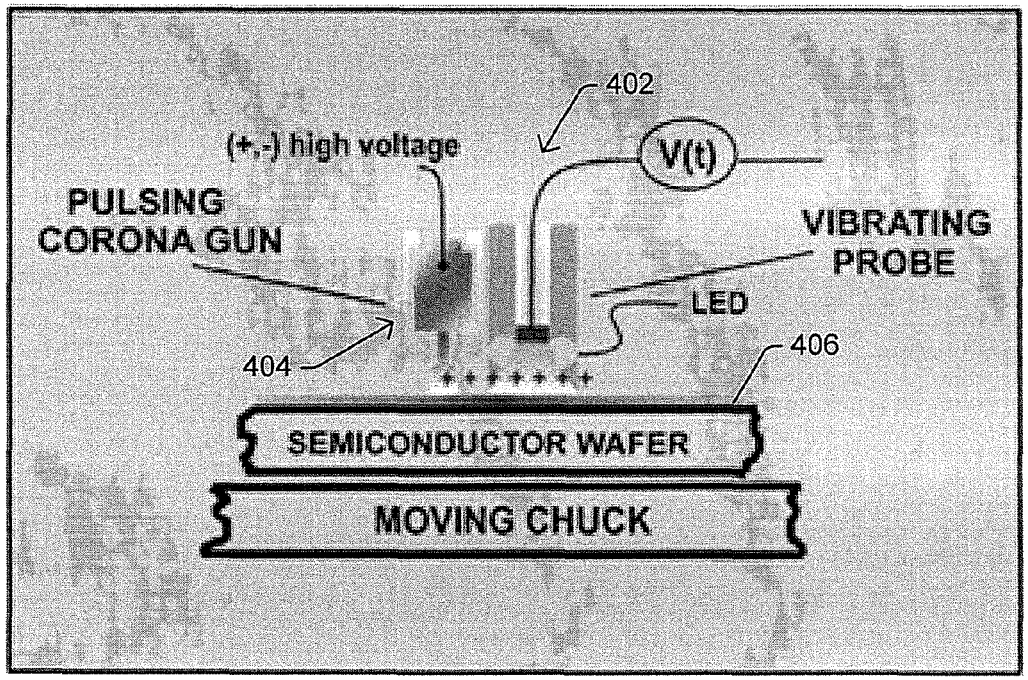
FIG. 4 shows a cross-sectional side view of some embodiments of a semiconductor processing apparatus in accordance with some embodiments.
Figure 5:
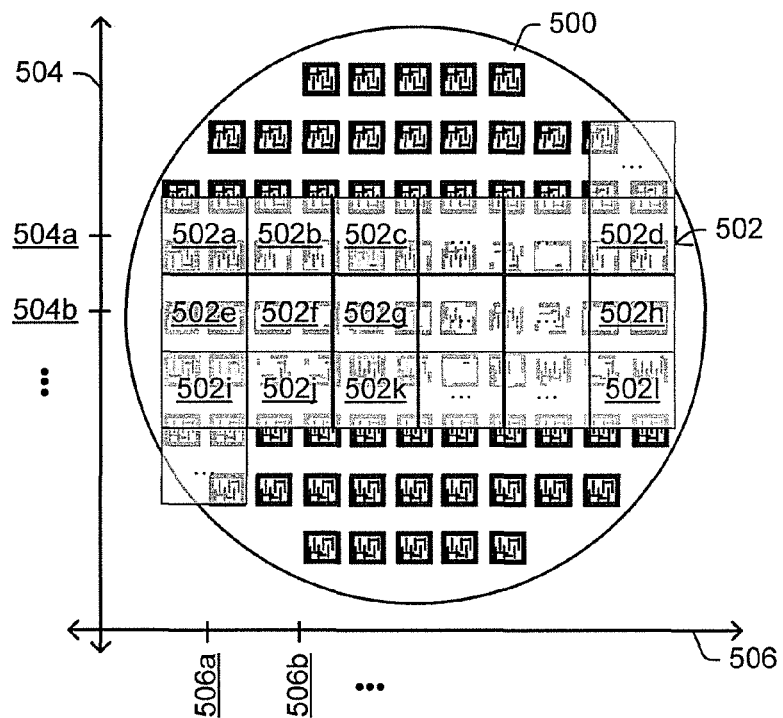
FIG. 5 shows a top view of some embodiments of a semiconductor processing apparatus in accordance with some embodiments.

FIG. 4, for example, shows an example where a scan assembly moves a voltage probe 402 and corona gun 404, which are affixed to one another, over a wafer surface 406. As shown in FIG. 5, the scan assembly (e.g., 320 in FIG. 3) can steppedly scan a voltage probe (e.g., 402 in FIG. 4) and corona gun (e.g., 404 in FIG. 4) over a two-dimensional grid to map voltages for surface regions of a wafer 500. This two-dimensional grid is made up of a plurality of surface regions 502. During operation, the voltage probe (e.g., 402 FIG. 4) steppedly takes voltage measurements at the discrete surface regions by moving along first and second axes 504, 506, which are perpendicular to one another. For example, the voltage probe can be set to position 504a on first axis 504 and position 506a on second axis 506, and take a voltage measurement for surface region 502a. The voltage probe can then be moved to position 506b on the second axis 506 and take a voltage measurement for surface region 502b. The voltage probe can then be stepped through surface regions 502c, . . . , 502d for position 504a on first axis 504, after which the voltage probe can be moved to position 504b and voltage measurements can be taken for surface regions 502e, 502f, 502g, and so on, until the surface voltages for the entire two dimensional wafer surface have been mapped. After each surface voltage has been measured, the corona gun can then selectively induce a corona discharge based on the measured surface voltage. The corona discharge can be selectively induced after each voltage measurement is taken, or the scan assembly can map the entire surface voltage in a first scan over the wafer and then go back and perform corona discharging as needed over the wafer surface in a separate second scan over the wafer. The corona gun can induce corona discharge for a surface region based on whether a difference between the measured voltage for the surface region and another surface region exceeds a predetermined threshold. For example, if most of the surface regions have a measured voltage of 0.5V, and a non-uniform surface region has a measured voltage of 1.2V, the corona gun can discharge over the non-uniform surface region to reduce the voltage from 1.2V to 0.5V to achieve uniform charge distribution for the wafer.

Figure 6:
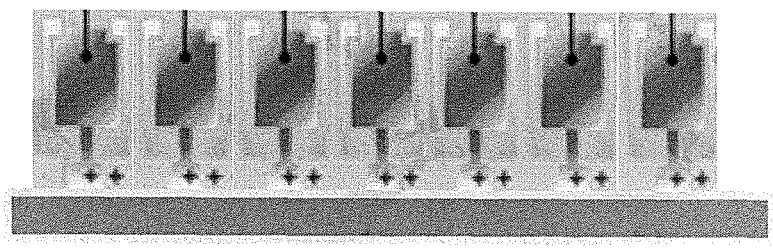
FIG. 6 shows a cross-sectional side view of some embodiments of a semiconductor processing apparatus in accordance with some embodiments.
Figure 7:
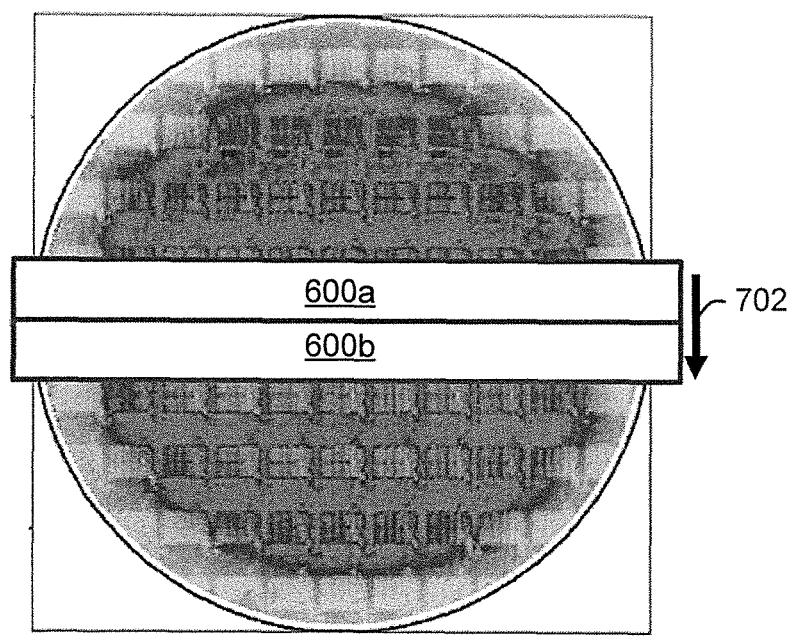
FIG. 7 shows a top view of some embodiments of a semiconductor processing apparatus in accordance with some embodiments.

FIG. 6 shows another embodiment where a plurality of corona discharge guns is arranged next to one another to form a corona discharge bar 600. As shown in FIG. 7, this corona discharge bar 600 can be stepped along a first axis 702 over the wafer (e.g., in first position 600a at a first time, and in second position 600b at a later time), and the individual corona guns within the corona discharge bar 600 can be fired based on the surface voltage measured at a given surface region. The embodiment of FIGS. 6-7 is advantageous over that of FIGS. 4-5 in that FIG. 6-7 can scan the wafer more quickly, however, it also requires more hardware (and hence tends to be more expensive).

It will be appreciated that identifiers such as "first" and "second" do not imply any type of ordering or placement with respect to other elements; but rather "first" and "second" and other similar identifiers are just generic identifiers. While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method, comprising:
   providing a semiconductor wafer having a surface region;
   performing a high density plasma chemical vapor deposition (HDP-CVD) process that results in excess charge build-up corresponding to a pre-catastrophic charge condition on the surface region;
   probing the surface region of the semiconductor wafer to determine whether the pre-catastrophic charge condition is present on the surface region, wherein the pre-catastrophic charge condition is capable of damaging a semiconductor device or feature on the semiconductor wafer; and
   based on whether the pre-catastrophic charge condition is present, selectively inducing a corona discharge to lessen or neutralize the pre-catastrophic charge condition before the wafer experiences catastrophic damage, wherein the HDP-CVD process is carried out in situ with the probing and the selective inducement of the corona discharge within a hermetically sealed process chamber.

2. The method of claim 1, wherein the pre-catastrophic charge condition corresponds to a non-uniform surface voltage condition as measured over a plurality of surface regions on the semiconductor wafer, and wherein the corona discharge is selectively induced to transform the non-uniform surface voltage condition to a uniform surface voltage condition for the plurality of surface regions.

3. The method of claim 1, wherein probing the surface region of the semiconductor wafer is performed by a Kelvin probe.

4. The method of claim 1, wherein the semiconductor wafer is a silicon wafer having a diameter of approximately 450 mm or more.

5. The method of claim 1, wherein a device on the semiconductor wafer has a gate length or gate width of less than 10 nm and has a gate dielectric thickness of less than approximately 1 nm.

6. The method of claim 1, wherein the HDP-CVD process results in a charge difference between the surface region and other surface regions on the semiconductor wafer.

7. The method of claim 1, further comprising,
mapping surface voltages for a two dimensional array on the surface region of the semiconductor wafer.

8. A semiconductor processing apparatus, comprising:
a chuck to retain a semiconductor wafer having a surface region, wherein the chuck is disposed within a hermetically sealed process chamber;
a high-density-plasma chemical vapor deposition (HDP-CVD) tool to carry out an HDP-CVD process on the semiconductor wafer that results in a surface voltage associated with an excess charge build-up;
a voltage probe to measure the surface voltage at the surface region of the semiconductor wafer while retained by the chuck, wherein the voltage probe is disposed within the hermetically sealed process chamber; and
a corona gun to selectively induce corona discharge to lessen or neutralize the excess charge build-up for the surface region, wherein the selectivity of the corona discharge inducement is based on whether the measured voltage for the surface region has a predetermined relationship with a voltage threshold, wherein the voltage threshold corresponds to a pre-catastrophic condition at which a semiconductor device or feature on the semiconductor wafer is subject to an increased risk of damage due to excess charge buildup, and wherein the HDP-CVD tool is configured to perform the HDP-CVD process in situ with the measuring and the selective inducement of the corona discharge within the hermetically sealed process chamber.

9. The apparatus of claim 8, wherein the voltage probe comprises a Kelvin probe.

10. The apparatus of claim 9, wherein the voltage probe comprises a vibrating capacitor that oscillates according to a pre-determined frequency.

11. The apparatus of claim 8,
wherein the semiconductor wafer is retained in the hermetically sealed process chamber while the HDP-CVD is carried out, and wherein the HDP-CVD process results in a charge difference between the surface region and other surface regions on the semiconductor wafer.

12. The apparatus of claim 11, wherein the voltage probe measures the surface voltage at the surface region in situ within the hermetically sealed process chamber after the HDP-CVD process is carried out.

13. The apparatus of claim 8, further comprising:
a scan assembly to provide relative movement between the chuck and the voltage probe along a first axis of the semiconductor wafer, where the voltage probe takes voltage measurements at discrete surface regions of the semiconductor wafer as movement occurs along the first axis.

14. The apparatus of claim 13, wherein the scan assembly is further configured to provide relative movement between the chuck and the voltage probe along a second axis which is perpendicular to the first axis, wherein the voltage probe takes voltage measurements at discrete surface regions of the semiconductor wafer as movement occurs along the second axis.

15. The apparatus of claim 14, wherein the voltage probe in coordination with the scan assembly maps surface voltages for a two dimensional array on the surface of the semiconductor wafer.

16. The apparatus of claim 15, wherein the corona gun selectively induces corona discharge for individual surface regions in the two-dimensional array based on voltage measurements taken for the individual surface regions, respectively.

17. The semiconductor processing apparatus of claim 8:
wherein the voltage probe is disposed within the hermetically sealed process chamber over the chuck; and
wherein the corona gun is disposed within the hermetically sealed process chamber, wherein measurement of the surface voltage and selectively inducement of the corona discharge occur in situ in the process chamber without opening the process chamber between the measurement and the selective inducement.

18. A semiconductor processing apparatus, comprising:
a chuck to retain a semiconductor wafer within a hermetically sealed chamber, the semiconductor wafer having a surface that terminates at a circumferential wafer edge;
a voltage probe disposed within the hermetically sealed chamber and configured to steppedly measure a plurality of surface voltages at a respective plurality of surface regions of the surface while the semiconductor wafer is retained by the chuck;
a controller to evaluate the plurality of measured surface voltages to determine whether a non-uniform charge distribution is present on the surface; and
a corona gun disposed within the hermetically sealed chamber and configured to, based on whether a measured voltage for a surface region has a predetermined relationship with a pre-catastrophic voltage threshold condition, selectively induce corona discharge for at least one of the plurality of surface regions to lessen or neutraliz the non-uniform charge distribution for the surface to a uniform charge distribution for the surface;
wherein the measuring of the plurality of surface voltages and the selective inducement of corona discharge are carried out in situ within the hermetically sealed chamber.

19. The semiconductor processing apparatus of claim 18, wherein the voltage probe is a Kelvin probe.

20. The semiconductor processing apparatus of claim 18, wherein the corona gun induces corona discharge for a surface region based on whether a difference between the measured voltage for the at least one surface region and another surface region exceeds a predetermined threshold.

* * * * *